United States Patent
Tanimura et al.

(10) Patent No.: US 12,018,370 B2
(45) Date of Patent: Jun. 25, 2024

(54) FILM-FORMING METHOD AND FILM-FORMING APPARATUS

(71) Applicant: Tokyo Electron Limited, Tokyo (JP)

(72) Inventors: Tatsuhiko Tanimura, Nirasaki (JP); Toru Kanazawa, Nirasaki (JP); Toshiyuki Ikeuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/756,213

(22) PCT Filed: Oct. 28, 2020

(86) PCT No.: PCT/JP2020/040444
§ 371 (c)(1),
(2) Date: May 19, 2022

(87) PCT Pub. No.: WO2021/100427
PCT Pub. Date: May 27, 2021

(65) Prior Publication Data
US 2022/0396874 A1    Dec. 15, 2022

(30) Foreign Application Priority Data
Nov. 20, 2019 (JP) ................................ 2019-209627

(51) Int. Cl.
C23C 16/455     (2006.01)
C23C 16/40      (2006.01)
C23C 16/44      (2006.01)

(52) U.S. Cl.
CPC ...... *C23C 16/45529* (2013.01); *C23C 16/402* (2013.01); *C23C 16/405* (2013.01); *C23C 16/4408* (2013.01)

(58) Field of Classification Search
CPC ..................................................... C23C 16/455
See application file for complete search history.

(56) References Cited

U.S. PATENT DOCUMENTS

2002/0094624 A1* 7/2002 Ahn ........................ H01L 28/40
                                                      257/E21.267
2012/0319252 A1   12/2012 Yamazaki
                  (Continued)

FOREIGN PATENT DOCUMENTS

JP   2010-067958 A   3/2010
JP   2013-140945 A   7/2013
                (Continued)

*Primary Examiner* — Mandy C Louie
(74) *Attorney, Agent, or Firm* — Armstrong Teasdale LLP

(57) ABSTRACT

A film-forming method includes: forming a first film by performing an operation of forming a unit film a plurality of times, the operation including sub-step of supplying a first raw material gas containing a first element to a substrate and causing the first raw material gas to be adsorbed thereon, and sub-step of supplying a first reaction gas to the substrate; and forming a second film on the substrate by performing an operation of forming a unit film at least once, the operation including sub-step of supplying a second raw material gas containing a second element to the substrate and causing the second raw material gas to be adsorbed thereon, and sub-step of supplying a second reaction gas to the substrate, wherein a mixed film is formed by performing the forming the first film and the forming the second film, respectively once, or a plurality of times.

10 Claims, 6 Drawing Sheets

(56) References Cited

U.S. PATENT DOCUMENTS

2014/0179121 A1\* 6/2014 Ikegawa ........... H01L 21/02164
 438/782
2019/0203354 A1\* 7/2019 Smith ................. H01L 21/0228
2019/0309413 A1\* 10/2019 Wu .................... C23C 16/45523

FOREIGN PATENT DOCUMENTS

WO 2011/093203 A1 8/2011
WO WO-2019050715 A1 \* 3/2019 ............. C23C 16/34

\* cited by examiner to the substrate and causing the second raw material gas to be adsorbed on the substrate and a sub-step of supplying a second reaction gas to the substrate and causing the second reaction gas to react with the second raw material gas, wherein a mixed film is formed by performing the forming the first film and the forming the second film once or by repeating the forming the first film and the forming the second film a plurality of times, and wherein the forming the second film further includes a sub-step of, prior to supplying the second raw material gas, supplying the first raw material gas to the substrate and causing the first raw material gas to be adsorbed on the substrate to suppress the adsorption of the second raw material gas.

FILM-FORMING METHOD AND FILM-FORMING APPARATUS

CROSS-REFERENCE TO RELATED APPLICATIONS

The present application is a U.S. National Stage Entry of International Patent Application No. PCT/JP2020/040444, filed Oct. 28, 2020, which claims the benefit of priority to Japanese Patent Application No. 2019-209627, filed Nov. 20, 2019, each of which is hereby incorporated herein by reference in its entirety.

TECHNICAL FIELD

The present disclosure relates to a film-forming method and a film-forming apparatus.

BACKGROUND

As a technique of manufacturing a mixed film containing two or more kinds of compounds, there is known a technique of alternately forming each compound on a substrate by an atomic layer deposition method (ALD) or a molecular layer deposition method (MLD) (in the following description, the ALD also includes the MLD).

For example, in Patent Document 1, there is proposed a technique of forming a mixed film of $ZrO_2$ and $SiO_2$ by alternately repeating a step of forming a $ZrO_2$ film on a substrate by ALD and a step of forming a $SiO_2$ film by ALD. Specifically, the step of forming the $ZrO_2$ film is performed by alternately supplying a Zr raw material gas and an oxidizing gas into a processing container x time, and the step of forming the $SiO_2$ film is performed by alternately supplying a Si raw material gas and an oxidizing gas y times. Then, the step of forming the $ZrO_2$ film and the step of forming the $SiO_2$ film are alternately repeated by z cycles to form a mixed film. In this technique, a ratio of $ZrO_2$ and $SiO_2$ is regulated by x and y, and a film thickness is regulated by z.

PRIOR ART DOCUMENTS

Patent Documents

Patent Document 1: Japanese laid-open publication No. 2010-67958

The present disclosure provides some embodiments of a film-forming method and a film-forming apparatus capable of regulating a film composition to a desired film composition without affecting a film thickness and a composition uniformity when forming a mixed film of two or more films by using ALD.

SUMMARY

According to an embodiment of the present disclosure, there is provided a film-forming method, including: forming a first film containing a first element on a substrate by performing an operation of forming a unit film on the substrate a plurality of times, the operation including a sub-step of supplying a first raw material gas containing the first element to the substrate and causing the first raw material gas to be adsorbed on the substrate and a sub-step of supplying a first reaction gas to the substrate and causing the first reaction gas to react with the first raw material gas; and forming a second film containing a second element different from the first element on the substrate by performing an operation of forming a unit film on the substrate at least once, the operation including a sub-step of supplying a second raw material gas containing the second element to the substrate and causing the second raw material gas to be adsorbed on the substrate and a sub-step of supplying a second reaction gas to the substrate and causing the second reaction gas to react with the second raw material gas, wherein a mixed film is formed by performing the forming the first film and the forming the second film once or by repeating the forming the first film and the forming the second film a plurality of times, and wherein the forming the second film further includes a sub-step of, prior to supplying the second raw material gas, supplying the first raw material gas to the substrate and causing the first raw material gas to be adsorbed on the substrate to suppress the adsorption of the second raw material gas.

According to the present disclosure, it is possible to provide a film-forming method and a film-forming apparatus capable of regulating a film composition to a desired film composition without affecting a film thickness and a composition uniformity when forming a mixed film of two or more films by using ALD.

DETAILED DESCRIPTION

Embodiments of the present disclosure will now be described in detail with reference to the accompanying drawings.

Film-Forming Method

First, embodiments of the film-forming method will be described.

First Embodiment

Figure 1:
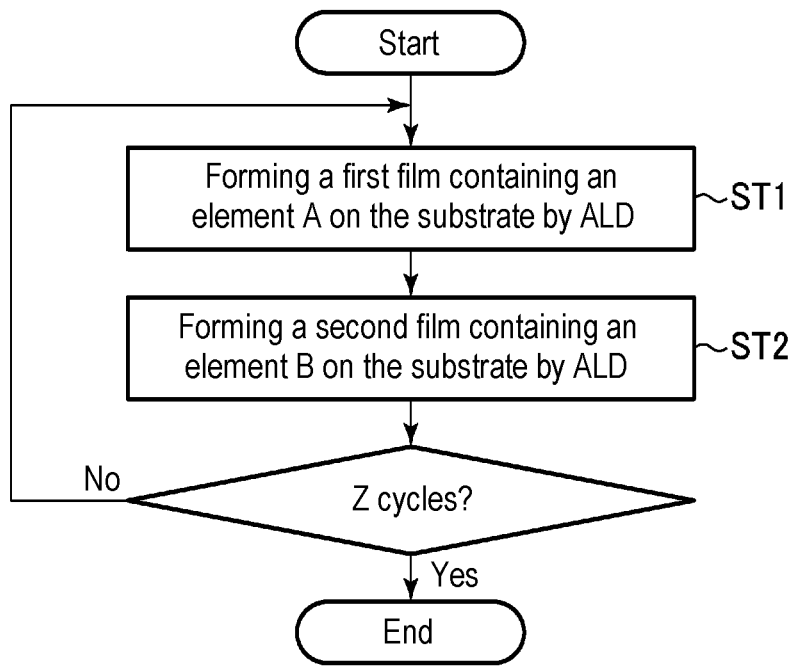
FIG. 1 is a flowchart schematically showing a film-forming method according to a first embodiment.
Figure 2:
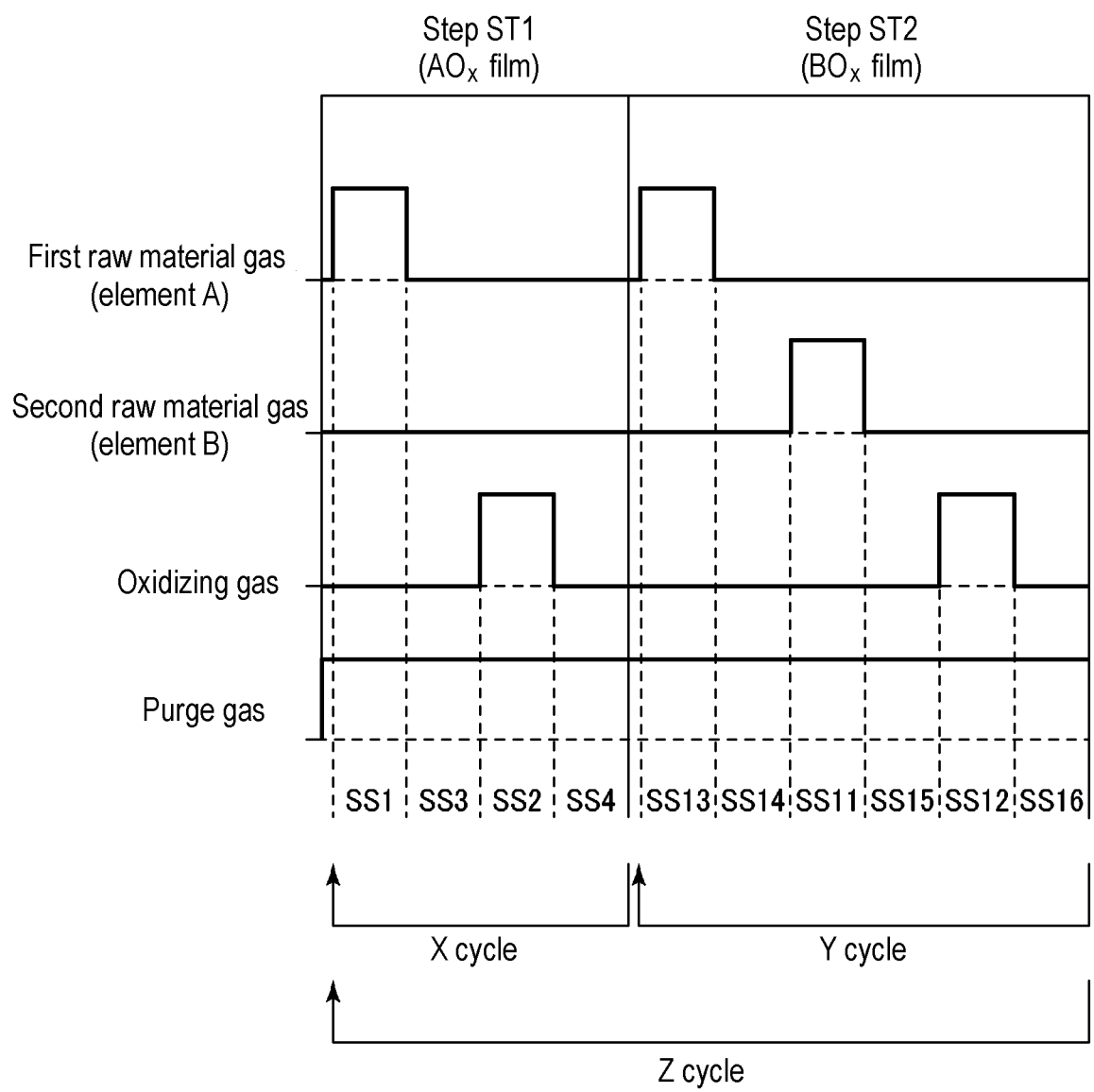
FIG. 2 is a timing chart showing a gas supply timing in the film-forming method according to the first embodiment.

FIG. 1 is a flowchart schematically showing a film-forming method according to a first embodiment, and FIG. 2 is a timing chart showing a gas supply timing in the film-forming method according to the first embodiment.

As shown in FIG. 1, the film-forming method according to the first embodiment is performed in a state in which a substrate is accommodated in a processing container. A step ST1 of forming a first film containing an element A on a substrate by ALD and a step ST2 of forming a second film containing an element B on the substrate by ALD, which constitute one cycle, are alternately performed in one or more predetermined cycles (Z cycles). As a result, a mixed film having a desired film thickness in which a ratio of the first film to the second film is regulated is formed. The first film and the second film are materials different from each other, and the number of cycles Z is appropriately set according to the film thickness of the mixed film to be formed.

The first film and the second film are typically compound films, such as oxide films, nitride films, carbide films and the like. However, one of the first film and the second film may be a compound film and the other may be a single substance film. As the element contained in these films, a metal element or a metalloid element is preferable. Examples of the element may include Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Te, Ba, La, Hf, Ta, W and Re. As the element of the first film and the element of the second film, those selected from the above-described group may be used.

The timing chart of FIG. 2 shows an example in which oxide films are formed as the first film and the second film.

The step ST1 of forming the first film includes a sub-step SS1 of supplying a first raw material gas containing an element A and a sub-step SS2 of supplying an oxidizing gas as a reaction gas. The first raw material gas supplied into the processing container in the sub-step SS1 is adsorbed on the substrate, and the oxidizing gas supplied in the sub-step SS2 reacts with the first raw material gas to form a unit film of an AOx film as a first film on the substrate. After the sub-step SS1 and the sub-step SS2, sub-steps SS3 and SS4 of purging an inside of the processing container with a purge gas are performed, respectively. The sub-step SS1 of supplying the first raw material gas containing the element A and the sub-step SS2 of supplying the oxidizing gas are repeated by a plurality of cycles (X cycles) with the sub-steps SS3 and SS4 of purging interposed therebetween. As a result, an AOx film having a predetermined film thickness is formed.

As the AOx film which is the first film, an oxide film containing an element selected from the above-mentioned elements may be used. As such an oxide film, for example, a high dielectric film (high-k film) such as an $HfO_2$ film, a $ZrO_2$ film, a $La_2O_3$ film, and a $Y_2O_3$ film may be used appropriately. Among these films, the $HfO_2$ film is particularly preferable.

The first raw material gas is not particularly limited as long as it can form a film containing a metal A and may be an organic compound or an inorganic compound. Taking the case of forming the $HfO_2$ film as an example, for example, an organic hafnium compound such as tetrakisdimethylaminohafnium ($Hf[N(CH_3)_2]_4$: TDMAH) or tri(dimethylamino)cyclopentadienylhafnium, and hafnium chloride ($HfCl_4$), and the like may be used.

The oxidizing gas is not particularly limited as long as it is generally used when forming an oxide film by ALD. For example, a gas selected from the group of an $O_2$ gas, an $O_3$ gas, a $H_2O$ gas and a $NO_2$ gas may be used as the oxidizing gas.

As the purging gas that purges the processing container, an inert gas, for example, a $N_2$ gas or a rare gas such as an Ar gas may be used. The purge gas may be supplied only at the timing of purging. However, as shown in FIG. 2, it is preferable to constantly supply the purge gas during the film-forming process.

The step ST2 of forming the second film includes a sub-step SS11 of supplying a second raw material gas containing an element B to the processing container and a sub-step SS12 of supplying an oxidizing gas as a reaction gas. This is the same as the above step ST1. The second raw material gas supplied in the sub-step SS11 is adsorbed on the substrate, and the oxidizing gas supplied in the sub-step SS12 reacts with the second raw material gas. However, in addition to these, the step ST2 may include a sub-step SS13 of causing the first raw material gas containing the element A to be adsorbed on the surface of the substrate prior to the sub-step SS11. This sub-step SS13 is performed to suppress the adsorption of the second raw material gas containing the element B.

The sub-steps SS13, SS11 and SS12 are followed by sub-steps SS14, SS15 and SS16 of purging the inside of the processing container, respectively. The sub-step SS13 of causing the first raw material containing the element A to be adsorbed on the surface of the substrate, the sub-step SS11 of supplying the second raw material gas containing the element B to the processing container, and the sub-step SS12 of supplying the oxidizing gas are performed by one cycle or a plurality of cycles (Y cycles) with the sub-steps SS14, SS15 and SS16 of purging interposed therebetween. As a result, a $BO_x$ film having a predetermined film thickness is formed. When a small amount of element B is added to the $AO_x$ film, typically, Y=1.

As the $BO_x$ film, which is the second film, an oxide film containing an element selected from the above-mentioned elements may be used. When the $AO_x$ film, which is the first film, is a high-k film (e.g., a $HfO_2$ film), for example, a $SiO_2$ film may be appropriately used as the $BO_x$ film which is the second film. The high-k film can be stabilized by adding a small amount of Si to the high-k film (e.g., $HfO_2$ film). Therefore, for the purpose of adding a small amount of Si to the high-k film, a $SiO_2$ film is formed as a $BO_x$ film to form a mixed film of the high-k film and the $SiO_2$ film. Further, since ferroelectricity is exhibited by adding a small amount of Si to the $HfO_2$ film, the mixed film of the $HfO_2$ film and the $SiO_2$ film of small amount may be applied to a ferroelectric memory.

The second raw material gas is not particularly limited as long as it can form the film containing the element B and may be an organic compound or an inorganic compound. Taking the case of forming the $SiO_2$ film as an example, a silane-based compound (monosilane ($SiH_4$), disilane ($Si_2H_6$), etc.), a silane chloride-based compound (dichlorosilane (DCS; $SiH_2Cl_2$), etc.), or an aminosilane-based compound (DMAS (dimethylaminosilane), etc.) may be appropriately used.

The oxidizing gas in step ST2 is not particularly limited as in the case of forming the first film. For example, a gas selected from the group of an $O_2$ gas, an $O_3$ gas, a $H_2O$ gas and a $NO_2$ gas may be used as the oxidizing gas. As the purge gas, an inert gas such as an $N_2$ gas or the like, which is the same as the purge gas used in the case of the step ST1 of forming the first film, may be used. It is preferable that as shown in FIG. 2, the purge gas is constantly supplied during the film-forming process.

The temperature and the pressure in the processing container when the step ST1 of forming the first film and the step ST2 of forming the second film are carried out are appropriately set according to the raw material gas and the oxidizing gas to be used. When a mixed film of an $HfO_2$ film and an $SiO_2$ film is formed by using tri(dimethylamino)cyclopentadienylhafnium and aminosilane as the raw material gas and using ozone as an oxidizing gas, it is preferable that the temperature is in the range of 250 to 500 degrees C. and the pressure is in the range of 100 to 1000 Pa. Further, it is preferable that the step ST1 of forming the first film and the step ST2 of forming the second film are carried out in the same processing container.

In FIG. 2, there is shown the case where the purge gas is constantly supplied during the film-forming process and the purge is performed when the first raw material gas, the second raw material gas and the oxidizing gas (reaction gas) are not supplied. However, the purge gas may be supplied only when the purge is performed.

Figure 3:
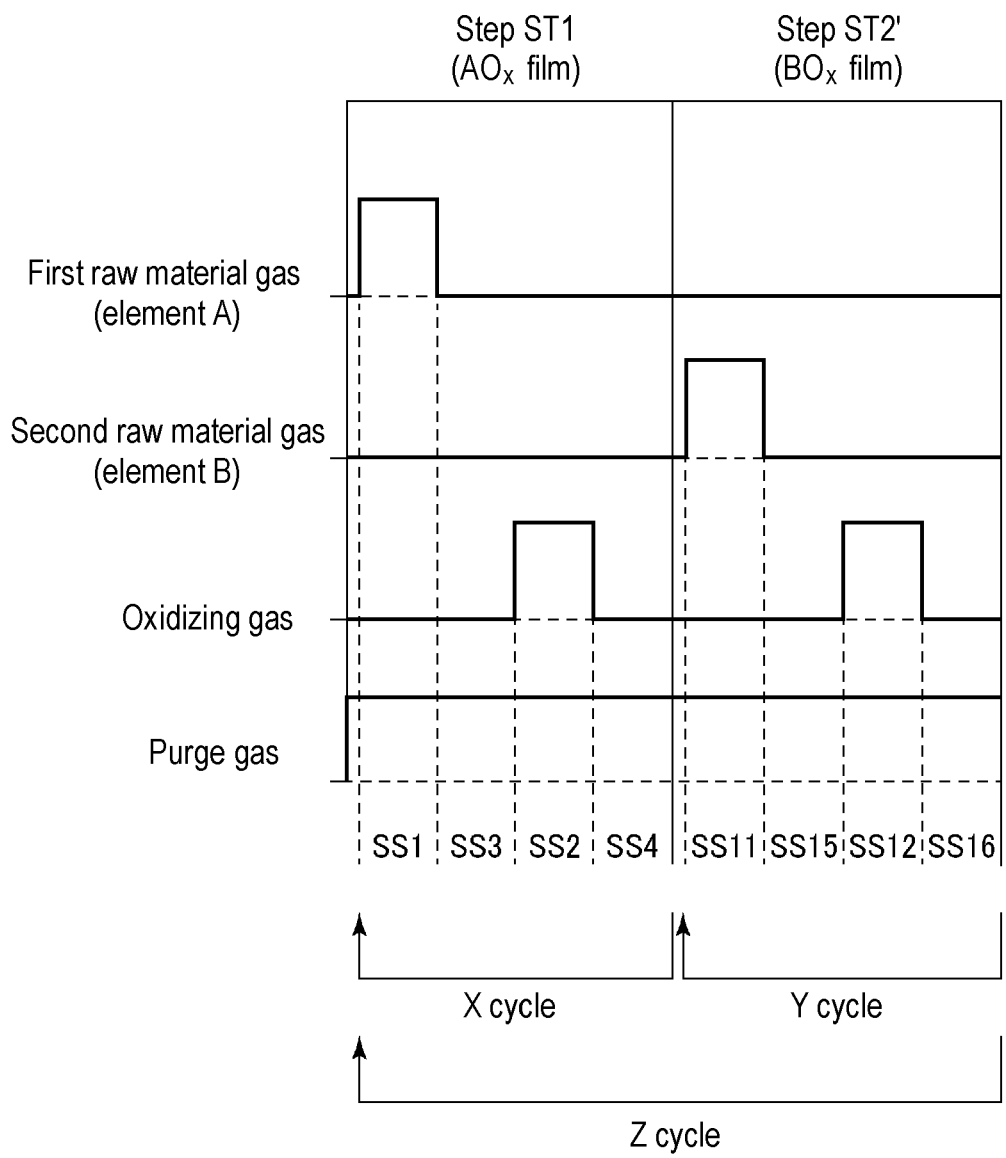
FIG. 3 is a timing chart showing a gas supply timing of a film-forming method in the related art.

In the related art, when a mixed film is formed by ALD, as shown in Patent Document 1, a ratio of the mixed film is regulated and a film composition is controlled by the number of ALD cycles x when forming the first film and the number of ALD cycles y when forming the second film. This state is shown in FIG. 3 in comparison with FIG. 2. The first film is formed by the same step ST1 as in the present embodiment that alternately performs the supply of the first raw material gas (SS1) and the supply of the oxidizing gas (SS2) by X cycles. The formation (ST2') of the second film is also performed by alternately performing the supply of the second raw material gas (SS11) and the supply of the oxidizing gas (SS12) by Y cycles.

In the method of FIG. 3 similar to Patent Document 1, when one wishes to make the concentration of the element B of the second film extremely low, it may be achieved by making the ratio of X and Y extremely low, for example, 30:1. However, in the ALD, the adsorption amount of the raw material gas at the time of formation of each film cannot be controlled to be less than an adsorption amount at which the raw material gas causes a self-limit. Therefore, if the ratio of X and Y is extremely low as 30:1, the number of films in one set becomes 31 which is extremely large. Therefore, there are problems that the thickness of the mixed film cannot be reduced and that the concentration of the element B tends to be non-uniform in the film thickness direction due to insufficient diffusion of the element.

Therefore, in the present embodiment, in the step ST2 of forming the second film, the sub-step SS13 of causing the first raw material gas containing the element A to be adsorbed on the surface of the substrate is executed before the second raw material gas containing the element B is supplied to the processing container, thereby suppressing the adsorption of the second raw material gas containing the element B. That is, by first causing the first raw material gas to be adsorbed on the substrate, the adsorption of the second raw material gas containing the element B is hindered and suppressed by the first raw material gas, and the adsorption amount of the second raw material gas may be reduced. Therefore, it is possible to form a mixed film having a very low concentration of the element B without increasing the film thickness and without making the concentration of the element B non-uniform. That is, when the mixed film of the first film and the second film is formed by the ALD, the film composition may be regulated to a desired film composition without affecting the film thickness and the composition uniformity.

Further, the first raw material gas used when forming the first film, which is the other film, is used as the inhibitory gas that inhibits the adsorption of the second raw material gas containing the element B. Therefore, it is not necessary to increase the number of gas supply systems and impurities in the film are not increased.

As described above, when the first raw material gas containing the element A is used as an adsorption inhibitor that inhibits the adsorption of the second raw material gas containing the element B, it is preferable that the first raw material gas and the second raw material gas do not react with each other substantially. Further, since the adsorption inhibition effect of the first raw material gas is changed depending on molecular weight of the first raw material gas, a size and electrical characteristics of the element A, and the like, it is preferable that the concentration of the element B is regulated by appropriately setting conditions according to combination of the first raw material gas and the second raw material gas.

The first raw material gas used as the adsorption inhibition gas in the step ST2 contributes as a part of the $AO_x$ film which is the first film.

The film-forming method of the present embodiment is effective for controlling the concentration when the concentration of the element B is extremely low. In that case, the number of cycles Y of the second film is typically one but may be plural. Further, in that case, the sub-step SS13 may not be performed at all of the plurality of times but may be performed at least once.

Figure 4:
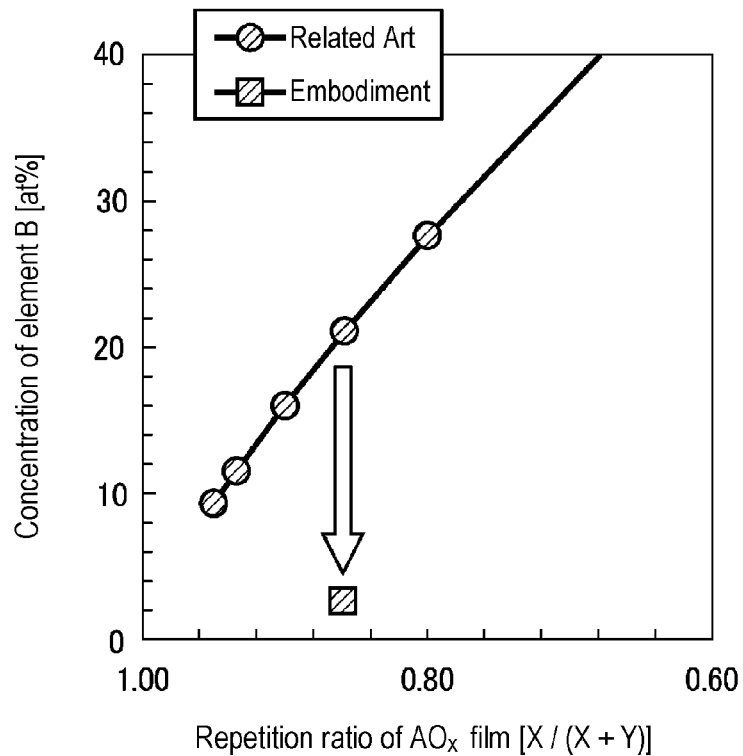
FIG. 4 is a view showing a relationship between a repetition ratio (X/(X+Y)) of an $AO_x$ film and a concentration of an element B when a mixed film of the $AO_x$ film and a $BO_x$ film is formed by the film-forming method of the embodiment and the film-forming method in the related art.

Next, experimental results by which effects of the present embodiment are grasped will be described. Here, the B concentration in the mixed film when the mixed film of the $AO_x$ film and the $BO_x$ film is actually formed by the method in the related art and the method of the present embodiment was obtained. Specifically, Hf was used as the element A and Si was used as the element B to form a mixed film of a $HfO_2$ film and a $SiO_2$ film. At this time, tri(dimethylamino)cyclopentadienylhafnium was used as an Hf raw material gas, an aminosilane compound was used as a Si raw material gas, ozone was used as an oxidizing gas, and a $N_2$ gas was used as a purge gas. The temperature was in the range of 250 to 500 degrees C. and the pressure was in the range of 100 to 1000 Pa. FIG. 4 is a diagram showing a relationship between the repetition ratio of the $AO_x$ film (X/(X+Y)) indicated on the horizontal axis and the concentration (at %) of the element B in the mixed film indicated on the vertical axis. The plot indicated by ● connected by solid lines is directed to the case of the method in the related art, and the plot indicated by ■ is directed to the case of the method of the present embodiment. In the related art, the concentration of the element B decreases as the repetition ratio of the $AO_x$ film increases. However, even when the repetition ratio is 0.95 (X=19, and Y=1), the concentration of the element B is as high as about 10 at %. Therefore, when trying to reduce the concentration of the element B to about several percent, it is necessary to make the repetition ratio as close to 1 as possible (i.e., to increase the number of cycles X as much as possible). On the other hand, in the plot in the present embodiment, when the number of cycles of the first film X=6 and the number of cycles of the second film Y=1, the repetition ratio of the $AO_x$ film is as small as 0.857. Nevertheless, the concentration of the element B is as small as 2 at %. In the related art, the repetition ratio is 0.857 which is the same as that of the present embodiment, and the concentration of the element B is about 20 at %. It can be noted that the concentration of the element B can be lowered even with a low repetition ratio according to the present embodiment.

Second Embodiment

Figure 5:
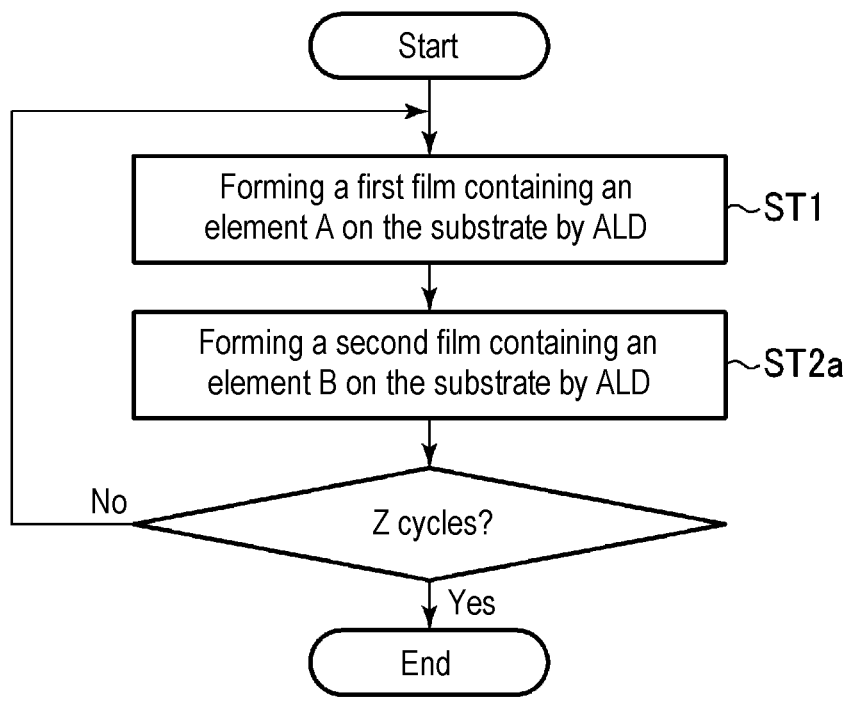
FIG. 5 is a flowchart schematically showing a film-forming method according to a second embodiment.
Figure 6:
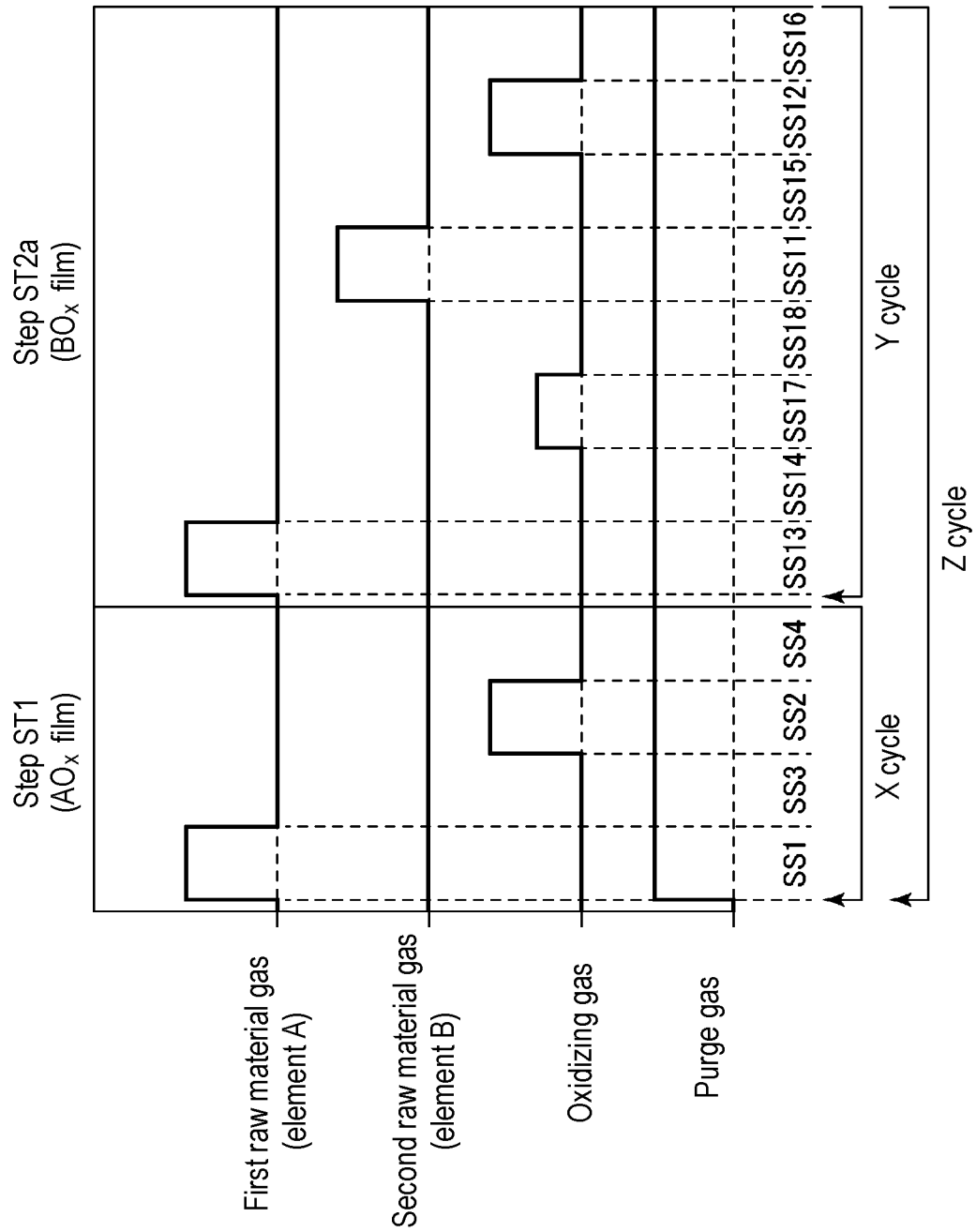
FIG. 6 is a timing chart showing a gas supply timing in the film-forming method according to the second embodiment.

FIG. 5 is a flowchart schematically showing a film-forming method according to a second embodiment, and FIG. 6 is a timing chart showing a gas supply timing in the film-forming method according to the second embodiment.

As shown in FIG. 5, in the second embodiment, a step ST1 of forming a first film containing an element A on a substrate by ALD and a ST2a of forming a second film containing an element B on the substrate by ALD, which constitute one cycle, are alternately performed one or more predetermined cycles (Z cycles). Thus, as in the first embodiment, a mixed film having a predetermined film thickness in which the ratio of the first film and the second film is regulated is formed.

The timing chart of FIG. 6 shows an example in which oxide films are formed as the first film and the second film as in FIG. 2 showing the first embodiment.

The step ST1 of forming the first film is performed in exactly the same manner as in the film-forming method according to the first embodiment. On the other hand, like the step ST2 of the film-forming method according to the first embodiment, the step ST2a of forming the second film includes a sub-step SS13 of causing a first raw material containing an element A to be adsorbed on the surface of the substrate, a sub-step SS11 of supplying a second raw material gas containing an element B, and a sub-step SS12 of supplying an oxidizing gas as a reaction gas. However, in the present embodiment, the step ST2a further includes a sub-step SS17 of insufficiently oxidizing the adsorbed first raw material after the sub-step SS13 of causing the first raw material to be adsorbed on the surface of the substrate and before the sub-step SS11 of supplying the second raw material gas. In this respect, the step ST2a is different from the step ST2. The sub-step SS17 is executed as a step of regulating an adsorption site of the second raw material gas.

The sub-steps SS13, SS17, SS11 and SS12 are followed by sub-steps SS14, SS18, SS15 and SS16 to purge the inside of the processing container, respectively. The sub-step SS13, the sub-step SS17, the sub-step SS11 and the sub-step SS12 are performed in one cycle or a plurality of cycles (Y cycles) with the purge steps SS14, SS18, SS15 and SS16 interposed therebetween. As a result, a $BO_x$ film having a predetermined film thickness is formed. As in the case with the film-forming method of the first embodiment, when a small amount of element B is added to the $AO_x$ film, typically, Y=1.

The sub-step SS17 of insufficiently oxidizing the adsorbed first raw material has a role of regulating the adsorption inhibition effect of the first raw material adsorbed in the sub-step SS13 with respect to the second raw material. When the sub-step SS11 is subsequently executed after causing the first raw material to be adsorbed on the substrate in the sub-step SS13, the adsorption amount of the second raw material may be too small. However, by insufficiently oxidizing the adsorbed first raw material in the sub-step SS17, the non-oxidized portion may be used as an adsorption site for the second raw material, and the adsorption amount of the second raw material may be regulated. As used herein, the expression "insufficiently oxidizing" refers to a process in which in the step ST1, the first raw material gas supplied in the sub-step SS1 is oxidized under a condition that the degree of oxidization is made smaller than that obtained when the first raw material gas is oxidized in the sub-step SS2. The sub-step SS17 of insufficiently oxidizing the adsorbed first raw material is performed by regulating at least one of an introduction time of the oxidizing gas, a supply amount/concentration of the oxidizing gas, a type of the oxidizing gas, and the like. Specifically, the insufficient oxidization is realized by making the introduction time of the oxidizing gas and the supply amount/concentration of the oxidizing gas shorter or smaller than those in the sub-step SS2, making the introduction time of the oxidizing gas shorter than that in the sub-step SS2, or using an oxidizing gas having weak oxidizing power. In this case, the degree of oxidization may be regulated by these oxidization conditions, whereby the adsorption amount of the second raw material may be regulated.

Film-Forming Apparatus

Next, a film-forming apparatus configured to perform the film-forming methods of the first embodiment and the second embodiment will be described.

Figure 7:
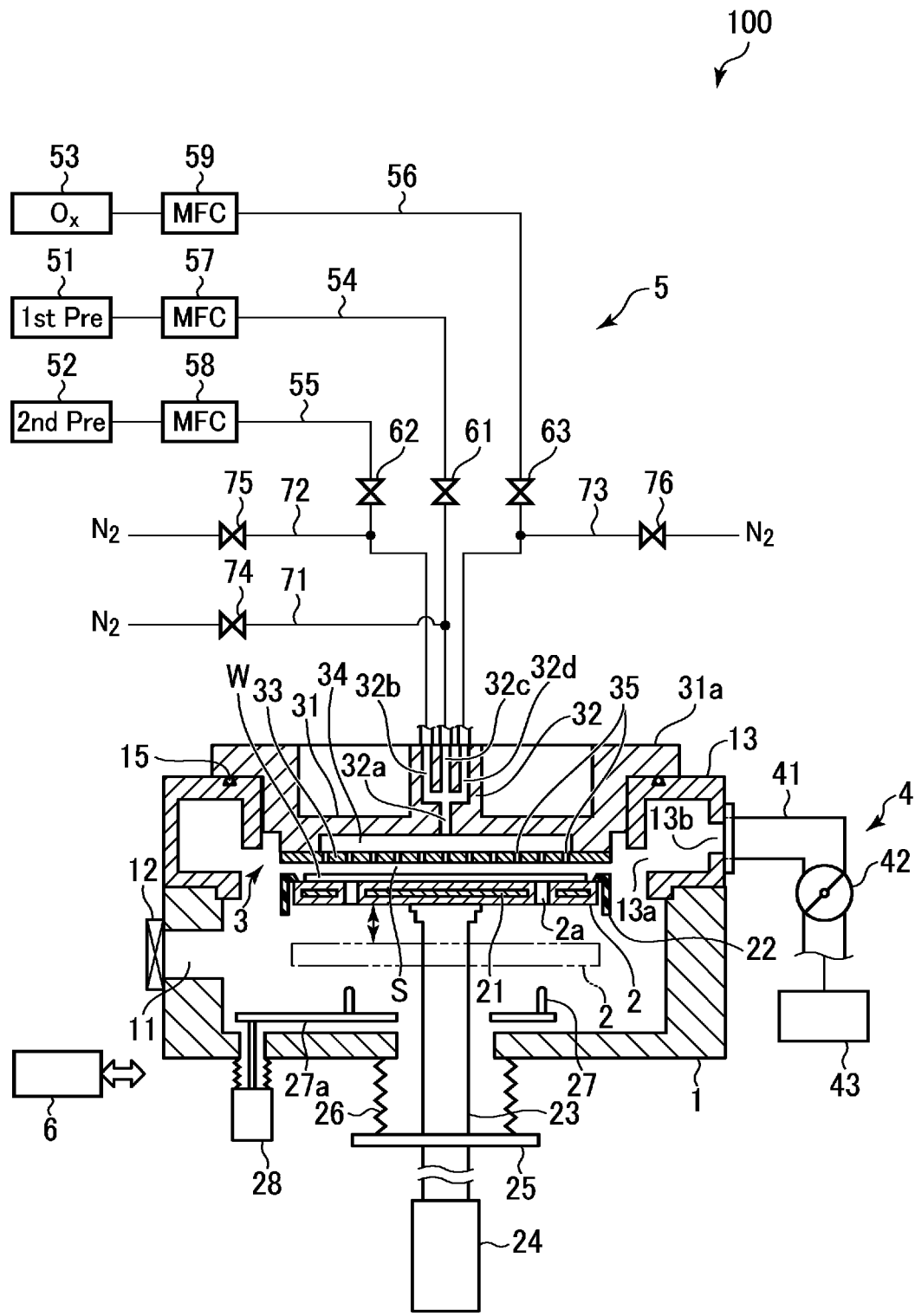
FIG. 7 is a cross-sectional view showing an example of a film-forming apparatus configured to perform the film-forming methods according to the first embodiment and the second embodiment.

FIG. 7 is a cross-sectional view showing an example of the film-forming apparatus configured to perform the film-forming methods of the first embodiment and the second embodiment. The film-forming apparatus 100 includes a chamber 1 which is a processing container, a susceptor (substrate support member) 2, a shower head 3, an exhaust part 4, a gas supply mechanism 5, and a controller 6.

The chamber 1 is made of a metal such as aluminum and has a substantially cylindrical shape. A loading/unloading port 11 configured to load and unload a semiconductor wafer (hereinafter simply referred to as a wafer) W, which is a substrate, is formed on the side wall of the chamber 1. The loading/unloading port 11 may be opened and closed by a gate valve 12. An annular exhaust duct 13 having a rectangular cross section is provided on the main body of the chamber 1. A slit 13a is formed in the exhaust duct 13 along an inner peripheral surface thereof. In addition, an exhaust port 13b is formed on the outer wall of the exhaust duct 13.

The susceptor 2 is configured to horizontally support the wafer W as a substrate in the chamber 1, has a disk shape with a size corresponding to the wafer W, and is supported by the support member 23. The susceptor 2 is made of, for example, nickel or the like, and may be covered with a quartz cover. Further, a heater 21 configured to heat the wafer W is embedded inside the susceptor 2. The heater 21 is supplied with electric power from a heater power supply (not shown) and is configured to generate heat. Then, the temperature of the wafer W is controlled to a predetermined temperature by controlling the output of the heater 21 in response to a temperature signal of a thermocouple (not shown) provided near the upper wafer mounting surface of the susceptor 2. The temperature of the susceptor 2 is controlled to, for example, 300 to 450 degrees C.

In the susceptor 2, a cover member 22 made of ceramics such as alumina or the like is provided so as to cover the outer peripheral region of the wafer mounting surface and the side surface of the susceptor 2.

The support member 23 that supports the susceptor 2 extends to below the chamber 1 from the center of the bottom surface of the susceptor 2 through a hole formed in the bottom wall of the chamber 1. The lower end of the support member 23 is connected to an elevating mechanism 24. The susceptor 2 can be raised or lowered by the elevating mechanism 24 via the support member 23 between a processing position shown in FIG. 1 and a transfer position at which the wafer can be transferred, which is indicated by a one-dot chain line below the processing position. Further, a flange portion 25 is attached to the support member 23 at a position below the chamber 1. A bellows 26 configured to isolate the atmosphere inside the chamber 1 from the outside air and designed to expand and contract as the susceptor 2 is raised or lowered is provided between the bottom surface of the chamber 1 and the flange portion 25.

Near the bottom surface of the chamber 1, three wafer support pins 27 (only two of which are shown) are provided so as to protrude upward from an elevating plate 27a. The wafer support pins 27 can be raised or lowered via the elevating plate 27a by a pin elevating mechanism 28 provided below the chamber 1 and can be inserted into through-holes 2a provided in the susceptor 2 located at the transfer position so as to protrude or retract with respect to the upper surface of the susceptor 2. By raising or lowering the wafer support pins 27, the wafer W is transferred between the wafer transfer mechanism (not shown) and the susceptor 2.

The shower head 3 is made of, for example, aluminum, and is provided so as to face the susceptor 2. The shower head 3 functions as a gas introduction member. The shower head 3 includes a main body portion 31, a gas introduction portion 32, and a shower plate 33. The main body portion 31 has a substantially disk shape with a recess serving as a gas diffusion space 34 formed at the center thereof. A mounting member 31a having a cylindrical shape with a flange extending upward is provided at the outer edge of the main body portion 31. The flange portion of the mounting member 31a is supported on the upper surface of the exhaust duct 13, and the gap between the flange portion of the mounting member 31a and the exhaust duct 13 is hermetically sealed with a seal ring 15. The shower plate 33 is attached to the underside of the main body portion 31, and a gas diffusion space 34 is defined by the upper surface of the shower plate 33. The shower plate 33 has a plurality of gas discharge holes 35 configured to discharge a gas from the gas diffusion space 34. The gas introduction portion 32 is provided at the center of the upper part of the main body portion 31. The gas introduction portion 32 has a lower gas flow path 32a connected to the gas diffusion space 34 and three upper gas flow paths 32b, 32c and 32d connected to the lower gas flow path 32a. In a state in which the susceptor 2 is located at the processing position, a processing space S is formed between the shower plate 33 and the susceptor 2.

The exhaust part 4 includes an exhaust pipe 41 connected to the exhaust port 13b of the exhaust duct 13, a pressure control valve (APC) 42 connected to the exhaust pipe 41, and an exhaust mechanism 43 including a vacuum pump. At the time of processing, the gas in the chamber 1 reaches the exhaust duct 13 through the slit 13a and is exhausted from the exhaust duct 13 through the exhaust pipe 41 by the exhaust mechanism 43 of the exhaust part 4.

The gas supply mechanism 5 includes a first raw material gas supply source (1st Pre) 51 configured to supply a first raw material gas containing an element A, a second raw material gas supply source (2nd Pre) 52 configured to supply a second raw material gas containing an element B, and an oxidizing gas supply source ($O_x$) 53 configured to supply an oxidizing gas. As described above, the first raw material gas and the second raw material gas are appropriately selected according to the element A and the element B. Further, as the oxidizing gas, the above-mentioned $O_2$ gas or the like may be used. A first gas supply pipe 54 extends from the first raw material gas supply source (1st Pre) 51, a second gas supply pipe 55 extends from the second raw material gas supply source (2nd Pre) 52, and a third gas supply pipe 56 extends from the oxidizing gas supply source 53. These pipes are connected to the upper gas flow paths 32b, 32c and 32d provided in the gas introduction portion 32 of the shower head 3, respectively.

Flow rate controllers 57, 58, and 89 such as mass flow controllers or the like are provided in the first gas supply pipe 54, the second gas supply pipe 55, and the third gas supply pipe 56, respectively. In addition, high-speed valves 61, 62 and 63 are provided on the downstream sides of the flow rate controllers 57, 58, and 59, respectively.

The first raw material gas, the second raw material gas, and the oxidizing gas are supplied from the first gas supply pipe 54, the second gas supply pipe 55, and the third gas supply pipe 56 to the processing space S via the shower head 3. These supply operations may be intermittently performed by switching the high-speed valves 61, 62, and 63, which makes it possible to perform ALD film formation.

Further, purge gas pipes 71, 72, and 73 are connected to the first gas supply pipe 54, the second gas supply pipe 55, and the third gas supply pipe 56 on the downstream sides of the high-speed valves 61, 62, and 63, respectively. From these purge gas pipes 71, 72, and 73, a purge gas, for example, a $N_2$ gas is supplied to the first gas supply pipe 54, the second gas supply pipe 55, and the third gas supply pipe 56. Valves 74, 75, and 76 are provided in the purge gas pipes 71, 72, and 73, respectively. The purge gas reaches the shower head 3 from the purge gas pipes 71, 72, and 73 via the first to third gas supply pipes 54, 55, and 56, and is supplied from the shower head 3 to the processing space S. The purge gas is constantly supplied as a counterflow during film formation and is used when purging the inside of the chamber 1.

The controller 6 controls the respective components, specifically, the flow rate controllers 57, 58, and 59, the high-speed valves 61, 62, and 63, the power supply for the heater 21, the elevating mechanism 24, the pin elevating mechanism 28, the exhaust mechanism 43, and the like. The controller 6 includes a main controller including a computer (CPU), an input device, an output device, a display device, and a memory device. The memory device includes a storage medium that stores parameters of the process executed by the film-forming apparatus 100 and a program, i.e., a process recipe that controls the process executed by the film-forming apparatus 100. The main controller calls a predetermined process recipe stored in the storage medium and controls the film-forming apparatus 100 to perform a predetermined process based on the process recipe. In particular, the controller 6 controls the valves 74, 75, and 76 to be opened such that the purge gas is constantly supplied, and controls the high-speed valves 61, 62, and 63 to realize the film-forming methods according to the first embodiment and the second embodiment.

In the film-forming apparatus 100 configured as described above, the controller 6 regulates the gap between the susceptor 2 and the shower head 3, controls the heater 21 to heat the susceptor 2 to a predetermined temperature, and controls the gas supply mechanism 5 and the exhaust mechanism 4 so as to supply the respective gases in the sequence of FIG. 2 or FIG. 6 that realizes the film-forming method of the first embodiment or the second embodiment. As a result, a mixed film of the first film and the second film is formed.

Other Applications

Although the embodiments have been described above, the embodiments disclosed herein should be considered to be exemplary and not limitative restrictive in all respects. The above-described embodiments may be omitted, replaced or modified in various forms without departing from the scope of the appended claims and their gist.

For example, in the above-described embodiments, the oxide gas is used as the reaction gas, and the mixed film is formed as the oxide film for both the first film and the second film. However, other reaction gases such as a nitriding gas and a carbonizing gas may be used as the reaction gas to form other compound films such as a nitride film and a carbide film. Further, the first film and the second film may be formed using different reaction gases, whereby both may be different types of compound films such as an oxide film and a nitride film. In addition, as described above, a reducing gas may be used as the reaction gas for forming either one of the films to form a metal film, and the first film and the second film may be a combination of a compound film and a metal film.

Further, in the second embodiment, there has been described the example where in the step of forming the second film, after the step of causing the first raw material to be adsorbed on the surface of the substrate, the step of insufficiently oxidizing the adsorbed first raw material for the purpose of regulating the adsorption site of the second raw material. However, this step is not limited to the oxidization but may be a step of insufficiently reacting with another reaction gas.

Further, the above-described film-forming apparatus is an example, and the structure of the film-forming apparatus is not particularly limited as long as it is capable of performing ALD film formation. In addition to the illustrated single-substrate type film-forming apparatus, it is also possible to use a batch-type film-forming apparatus configured to collectively form films on a plurality of substrates.

Further, in the above-described embodiments, the semiconductor wafer is illustrated as an example of the substrate. However, the substrate is not limited to the semiconductor wafer but may be a glass substrate used for an FPD (flat panel display) or other substrates such as a ceramic substrate and the like.

EXPLANATION OF REFERENCE NUMERALS

1: chamber, 2: susceptor, 3: shower head, 4: exhaust part, 5: gas supply mechanism, 6: controller, 51: first raw material gas supply source, 52: second raw material gas supply source, 53: oxidizing gas supply source, 54, 55, and 56: gas supply pipe, 61, 62, and 64: high-speed valve, 71, 72, and 73: purge gas pipe, 100: film-forming apparatus, W: semiconductor wafer (substrate)

What is claimed is:

1. A film-forming method, comprising:
    forming a first film containing a first element on a substrate by performing an operation of forming a unit film on the substrate a plurality of times, the operation including a sub-step of supplying a first raw material gas containing the first element to the substrate and causing the first raw material gas to be adsorbed on the substrate and a sub-step of supplying a first reaction gas to the substrate and causing the first reaction gas to react with the first raw material gas; and
    forming a second film containing a second element different from the first element on the substrate by performing an operation of forming a unit film on the substrate at least once, the operation including a sub-step of supplying a second raw material gas containing the second element to the substrate and causing the second raw material gas to be adsorbed on the substrate and a sub-step of supplying a second reaction gas to the substrate and causing the second reaction gas to react with the second raw material gas,
    wherein a mixed film is formed by performing each of the forming the first film and the forming the second film respectively once or a plurality of times,
    wherein the forming the second film further includes a sub-step of suppressing the adsorption of the second raw material gas, by supplying the first raw material gas to the substrate and causing the first raw material gas to be adsorbed on the substrate, and
    wherein the sub-step of suppressing the adsorption of the second raw material gas is performed after the sub-step of supplying the first reaction gas is performed and before the sub-step of supplying the second raw material gas, without re-supplying the first reaction gas before the sub-step of supplying the second raw material gas.

2. The method of claim 1, comprising: purging an inside of a processing container by supplying a purge gas into the processing container after performing the sub-step of supplying the first raw material gas, the sub-step of supplying the second raw material gas, the sub-step of supplying the first reaction gas, and the sub-step of supplying the second reaction gas respectively.

3. The method of claim 1, wherein the first film and the second film are compound films.

4. The method of claim 1, wherein the first element and the second element are selected from the group of Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Te, Ba, La, Hf, Ta, W and Re.

5. The method of claim 1, wherein the forming the second film further includes a sub-step of causing a third reaction gas to insufficiently react with the first raw material gas adsorbed on the substrate, which is executed after the sub-step of supplying the first raw material gas to the substrate and causing the first raw material gas to be adsorbed on the substrate and before the sub-step of supplying the second raw material gas.

6. The method of claim 1, wherein the first reaction gas used when forming the first film and the second reaction gas used when forming the second film are oxidizing gases, and oxide films are formed as the first film and the second film.

7. The method of claim 6, wherein the forming the second film further includes a sub-step of insufficiently oxidizing the first raw material gas adsorbed on the substrate with an oxidizing gas, which is executed after the sub-step of supplying the first raw material gas to the substrate and causing the first raw material gas to be adsorbed on the substrate and before the sub-step of supplying the second raw material gas.

8. The method of claim 7, wherein the sub-step of insufficiently oxidizing the first raw material gas is performed by regulating at least one of an introduction time of the oxidizing gas, a supply amount/concentration of the oxidizing gas, and a type of the oxidizing gas.

9. The method of claim 6, wherein the oxide film constituting the first film is a high-k film, and the oxide film constituting the second film is a $SiO_2$ film.

10. The method of claim 9, wherein the high-k film, which is the oxide film constituting the first film, is a $HfO_2$ film.

* * * * *